US009666631B2

(12) United States Patent
Lyu et al.

(10) Patent No.: US 9,666,631 B2
(45) Date of Patent: May 30, 2017

(54) PHOTODIODE AND FILTER CONFIGURATION FOR HIGH DYNAMIC RANGE IMAGE SENSOR

(71) Applicant: OMNIVISION TECHNOLOGIES, INC., Santa Clara, CA (US)

(72) Inventors: Jeong-Ho Lyu, San Jose, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/280,880

(22) Filed: May 19, 2014

(65) Prior Publication Data

US 2015/0333099 A1 Nov. 19, 2015

(51) Int. Cl.
*H01L 27/146* (2006.01)
*H04N 5/3745* (2011.01)

(52) U.S. Cl.
CPC .. *H01L 27/14641* (2013.01); *H01L 27/14621* (2013.01); *H01L 27/14625* (2013.01); *H01L 27/14627* (2013.01); *H01L 27/14643* (2013.01); *H01L 27/14647* (2013.01); *H04N 5/37457* (2013.01)

(58) Field of Classification Search
CPC ... F21K 9/17; F21K 9/90; H01L 33/62; H01L 33/60; H01L 25/13; H01L 33/005; H01L 33/58; H01L 2933/0058; H01L 2933/0066; H01L 2924/0002; H01L 2924/00; F21V 7/005; F21Y 2101/02; F21Y 2103/003
USPC .............................................. 257/88; 438/27
See application file for complete search history.

(56) References Cited

U.S. PATENT DOCUMENTS

| 2009/0142673 | A1 | 6/2009 | Gao et al. |
| 2009/0200589 | A1 | 8/2009 | Qian et al. |
| 2012/0273906 | A1 | 11/2012 | Mackey et al. |
| 2014/0103270 | A1 | 4/2014 | Oota |

FOREIGN PATENT DOCUMENTS

| TW | 200950074 A1 | 12/2009 |
| TW | 201301492 A1 | 1/2013 |

OTHER PUBLICATIONS

TW Patent Application No. 103133805—Taiwanese Office Action and Search Report, dated Aug. 8, 2016, with English Translation, 16 pages.
U.S. Appl. No. 13/784,351, filed Mar. 4, 2013, Chen et al.

(Continued)

*Primary Examiner* — Hrayr A Sayadian
(74) *Attorney, Agent, or Firm* — Blakely Sokoloff Taylor & Zafman LLP (57) ABSTRACT

An image sensor pixel includes a first photodiode, a second photodiode, a first microlens, a second microlens, and a filter. The first and second photodiode are disposed adjacent to each other in a semiconductor material. The first photodiode has a first full well capacity that is substantially equal to a second full well capacity of the second photodiode. The first microlens is disposed over the first photodiode and the second microlens is disposed over the second photodiode. The second microlens is substantially identical to the first microlens. The filter is disposed between the second microlens and the second photodiode to reduce an intensity of the image light incident upon the second photodiode. The filter does not substantially affect the image light directed toward the first photodiode.

20 Claims, 8 Drawing Sheets

(56) References Cited

OTHER PUBLICATIONS

U.S. Appl. No. 14/070,286, filed Nov. 1, 2013, Chen et al.
U.S. Appl. No. 14/135,066, filed Dec. 19, 2013, Lyu et al.
"Multi-tone Photomasks to Increase Production Efficiency and Quality of Panels," Technology of SKE: Products, SK-Electronics Co., Ltd., n.d., retrieved from http://www.sk-el.co.jp/en/products/feature2-2.html on May 19, 2014, 2 pages.
TW Patent Application No. 103133805—Taiwanese Office Action, dated Dec. 7, 2016, with English Translation, 15 pages.

PHOTODIODE AND FILTER CONFIGURATION FOR HIGH DYNAMIC RANGE IMAGE SENSOR

TECHNICAL FIELD

This disclosure relates generally to image sensor, and in particular but not exclusively, relates to pixels in high dynamic range image sensors.

BACKGROUND INFORMATION

High dynamic range ("HDR") image sensors are useful for many applications. In general, ordinary image sensors, including for example charge coupled device ("CCD") and complementary metal oxide semiconductor ("CMOS") image sensors, have a dynamic range of approximately 70 dB dynamic range. In comparison, the human eye has a dynamic range of up to approximately 100 dB. There are a variety of situations in which an image sensor having an increased dynamic range is beneficial. For example, image sensors having a dynamic range of more than 100 dB are needed in the automotive industry in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One known approach for implementing HDR image sensors is to use a combination pixel. One sub-pixel can be used to sense bright light conditions while another sub-pixel can be used to sense low light conditions. However, this approach usually includes physical and electrical difference between different photodiodes in the sub-pixels. These differences can create challenges in processing the image signals generated from the different photodiodes. As a consequence, more complicated and less efficient read out and measuring electronics may need to be selected to read out the different photodiodes at the desired accuracy.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an imaging system and image pixels for a high dynamic range ("HDR") imaging system are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
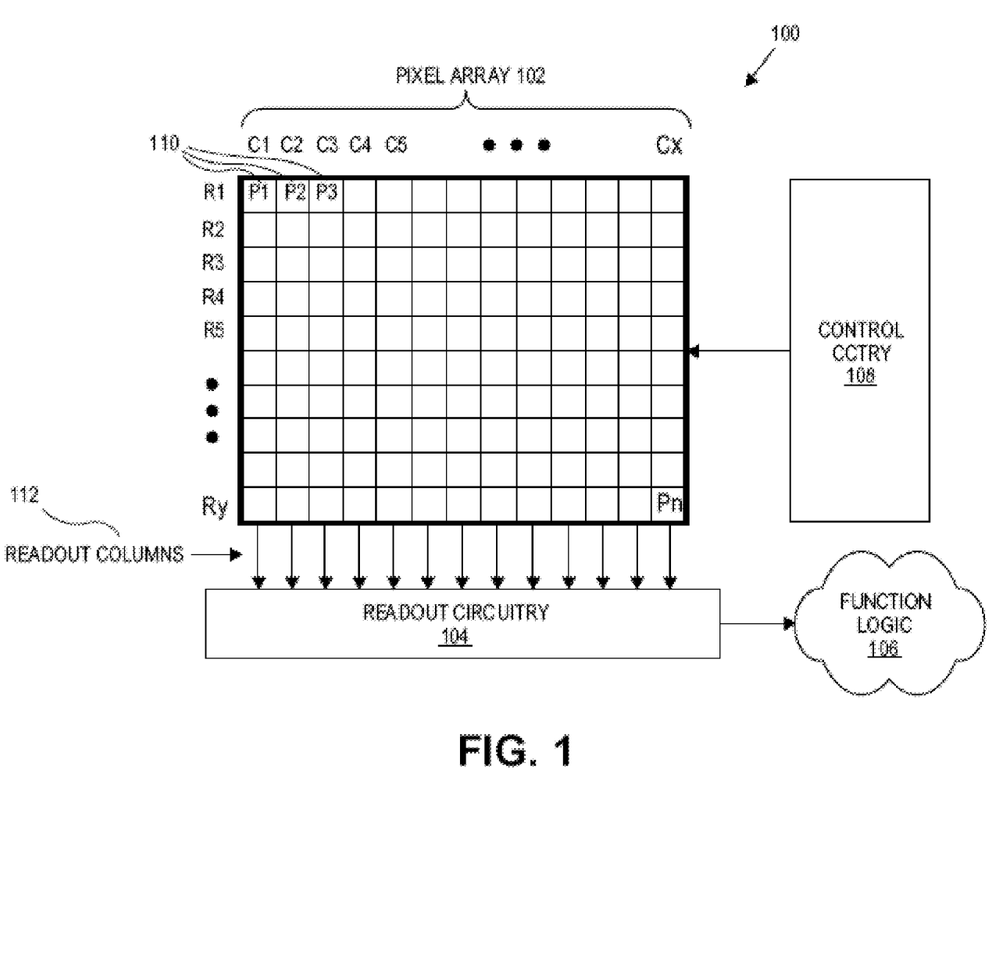
FIG. 1 is a block diagram schematic illustrating one example of a high dynamic range ("HDR") imaging system, in accordance with an embodiment of the disclosure.

FIG. 1 is a block diagram schematic illustrating one example of an HDR imaging system 100, in accordance with an embodiment of the disclosure. HDR imaging system 100 includes an example pixel array 102, control circuitry 108, readout circuitry 104, and function logic 106. As shown in the depicted example, HDR imaging system 100 includes pixel array 102 which is coupled to control circuitry 108 and readout circuitry 104. Readout circuitry 104 is coupled to function logic 106. Control circuitry 108 is coupled to pixel array 102 to control operational characteristics of pixel array 102 in order to capture images generated by image light received by pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

In one example, pixel array 102 is a two-dimensional (2D) array of imaging sensors or pixels 110 (e.g., pixels P1, P2 . . . , Pn). In one example, each pixel 110 is a CMOS imaging pixel having more than one photodiode. As illustrated, each pixel 110 is arranged into a row (e.g., rows R1 to Ry) and a column (e.g., column C1 to Cx) to acquire image data of a person, place, object, etc., which can then be used to render an image of the person, place, object, etc.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously. The image charge generated by different photodiodes of pixel 110 may be read out separately during different time periods.

Figure 2:
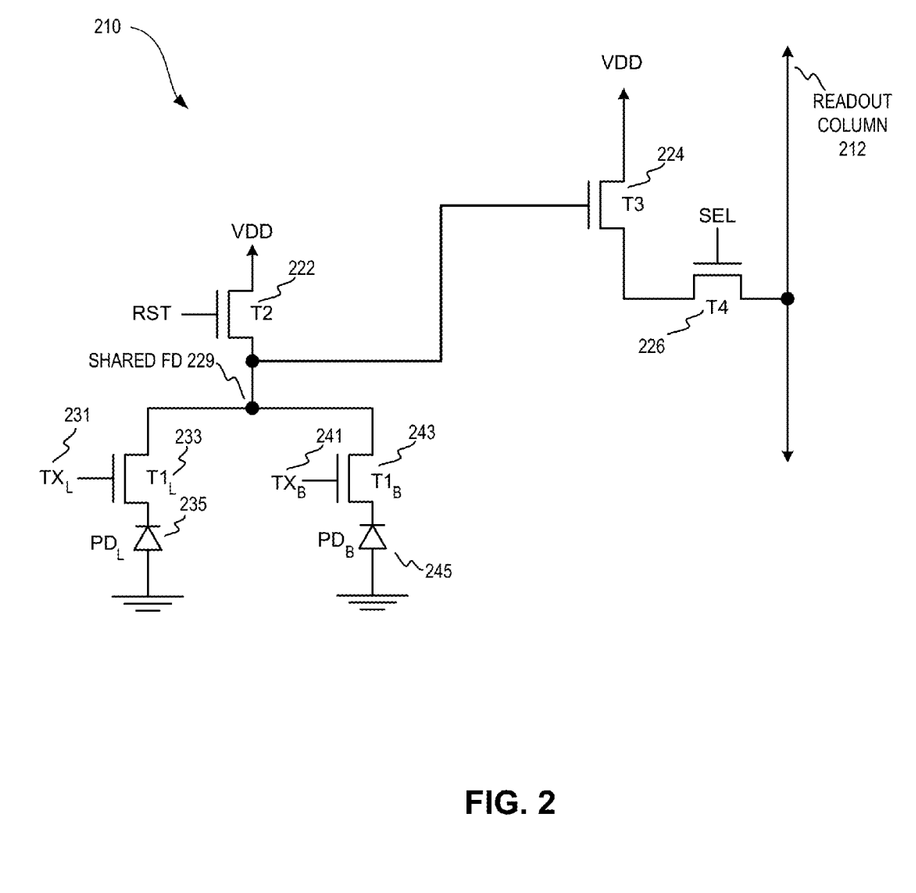
FIG. 2 is a schematic illustrating one example of an HDR pixel that can be implemented in the HDR image sensor illustrated in FIG. 1, in accordance with an embodiment of the disclosure.

FIG. 2 is a schematic illustrating one example of an HDR pixel 210 that can be implemented as pixel(s) 110 in HDR imaging system 100, in accordance with an embodiment of the disclosure. HDR Pixel 210 includes a first photodiode 235 ($PD_L$) and a second photodiode 245 ($PD_B$). First photodiode 235 may be configured to measure low light data and second photodiode 245 may be configured to measure bright light data. Transfer transistor 233 ($T1_L$) is coupled between first photodiode 235 and shared floating diffusion 229 to transfer first image charge from the first photodiode 235 to shared floating diffusion 229. Transfer transistor 243 ($T1_B$) is coupled between second photodiode 245 and shared floating diffusion 229 to transfer second image charge from the second photodiode 245 to shared floating diffusion 229. Transfer transistor 233 ($T1_L$), transfer transistor 243 ($T1_B$), first photodiode 235, and second photodiode 245 are disposed in a semiconductor material (e.g. silicon), in one embodiment.

Image light incident on pixel 210 will generate image charge in each of the photodiodes 235 and 245. First image charge is generated in first photodiode 235 and second image charge is generated in second photodiode 245. When transfer transistor 233 receives a first transfer signal $TX_L$ 231 at its transfer gate, the first image charge is transferred to shared floating diffusion region 229. When second transfer transistors 243 receives second transfer signal $TX_B$ 241 at its transfer gate, the second image charge from photodiode 245 is transferred to shared floating diffusion region 229. The gates of first transfer transistor 233 and second transfer transistor 243 are coupled to be activated (turned ON) separately. In other words, first transfer signal $TX_L$ 231 and second transfer signal $TX_B$ 241 can be separately asserted.

To capture an image, the first image charge that accumulates in first photodiode 235 is switched through transfer transistor 233 into shared floating diffusion region 229 in response to a control signal $TX_L$ 231 being received on a first transfer gate of transfer transistor 233. A first image signal (corresponding to the first image charge transferred to shared floating diffusion 229) can then be amplified by amplifier transistor T3 224 and read out onto readout column 212 by activating row select transistor T4 226. In one example, amplifier transistor T3 224 is coupled in a source follower configuration as shown, which therefore amplifies the image signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, pixel 210 also includes reset transistor T2 222 coupled to shared floating diffusion region 229, which may be used to reset charge accumulated in pixel 210 in response to a reset signal RST. In one example, the charge in shared floating diffusion region 229 can be reset during an initialization period of pixel 210, or for example each time after charge information has been read out from pixel 210 and prior to accumulating charge in first photodiode 235 and second photodiode 245 for the acquisition of a new HDR image, in accordance with the embodiments of the disclosure.

Second image charge that accumulates in second photodiode 245 can be switched through transfer transistor 243 into shared floating diffusion region 229 in response to a control signal $TX_B$ 241 being received on a second transfer gate of second transfer transistor 243. A second image signal (corresponding to the second charge transferred to share floating diffusion 229) can be readout onto readout column 212 in a similar sequence as the first image signal so that a low light image signal/data can be readout from first photodiode 235 and a bright light image signal/data can be readout from second photodiode 245. Bright light image data and the low light image data from multiple HDR pixels 210 in a pixel array (e.g. pixel array 102) can be combined to generate an HDR image. HDR pixel 210 may be integrated into a frontside illuminated image sensor or a backside illuminated image sensor.

Figure 3:
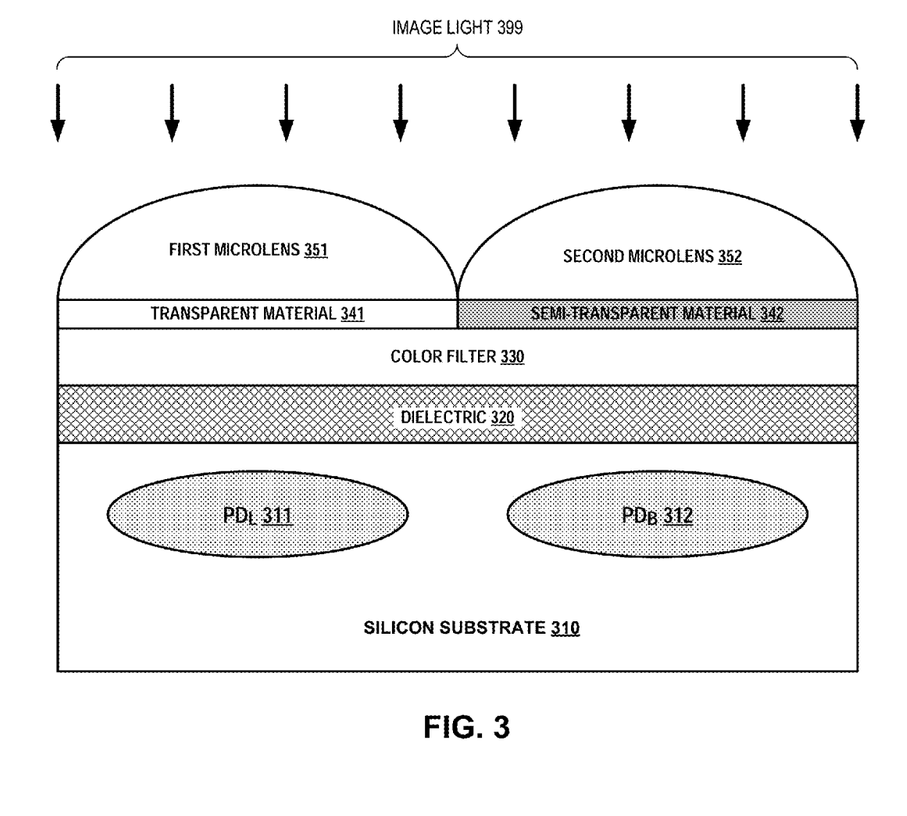
FIG. 3 is a cross-section illustration of two photodiodes and two microlenses that can be used in an example HDR pixel, in accordance with an embodiment of the disclosure.

First photodiode 235 can be configured to capture low light and second photodiode 245 can be configured to capture bright light using different design schemes. FIG. 3 is a cross-section illustration of a first photodiode 311, second photodiode 312, first microlens 351, second microlens 352, color filter 330, and dielectric layer 320, in accordance with an embodiment of the disclosure. Photodiodes 235 and 245 may be disposed in a silicon substrate similar to the illustrated first photodiode 311 and second photodiode 312 being disposed in silicon substrate 310. First photodiode 311 and second photodiode 312 are illustrated in order to illustrate aspects of the embodiments of the present disclosure, although in practice, photodiodes 311 and 312 may be arranged closer together First photodiode 311 and second photodiode 312 are both disposed in the same semiconductor material, which is illustrated as a silicon substrate 310 in FIG. 3. First photodiode 311 and second photodiode 312 have the same full well capacities or are at least designed to be the same but may of course be only substantially equal due to minute manufacturing process differences. First photodiode 311 and second photodiode 312 may be the same size and have the same dopant concentrations to have the same full well capacity. In one embodiment, first photodiode 311 and second photodiode 312 have the same light exposure area, where the light exposure area is defined as the area of the photodiode viewed looking down at the photodiode through the center of its corresponding microlens. In one embodiment, the light exposure area of first photodiode 311 and second photodiode 312 are shaped as hexagons. First photodiode 311 is for capturing low light and second photodiode 312 is for capturing bright light.

First microlens 351 is disposed over first photodiode 311 to direct image light 399 toward first photodiode 311. Second microlens 352 is disposed over second photodiode 312 to direct image light 399 toward second photodiode 312. First microlens 351 is designed to be identical to second microlens 352, but of course small differences in manufacturing processes may make first microlens 351 and second microlens 352 merely substantially identical. A color filter 330 is disposed between both microlenses 351/352 and photodiodes 311/312. Color filter 330 passes a specific color of image light 399 (e.g. red, green, or blue) while substantially blocking the image light that is other than the specific color. Dielectric layer 320 is disposed between silicon substrate 310 and color filter 330, in the illustrated embodiment. Dielectric layer 320 may include Low-Pressure Chemical Vapor Deposition ("LPCVD") silicon dioxide or spun on silicon dioxide.

In FIG. 3, semi-transparent material 342 is disposed between second microlens 352 and second photodiode 312 while transparent material 341 is disposed between first microlens 351 and first photodiode 311. Transparent material 341 is more transmissive (letting more visible light through) than semi-transparent material 342. The result is that semi-transparent material 342 reduces the intensity of image light 399 that is incident on second photodiode 312 in comparison to the image light 399 that is incident on first photodiode 311. Semi-transparent material 342 does not substantially affect the image light directed toward the first photodiode as it is disposed over second photodiode 312, but not disposed over first photodiode 311. In one embodiment, semi-transparent material 342 is 50% less transmissive than transparent material 341.

In one embodiment, semi-transparent material 342 is a layer of metal that is approximately fifty nanometers thick. In one embodiment semi-transparent material 342 includes a transparent photoresist that is impacted by a plasma of Nitrogen atoms to reduce the transparency. Although semi-transparent material 342 is illustrated as having the same thickness as transparent material 341 in FIG. 3, semi-transparent material 342 may be thicker than transparent material 341 and be made of the same substance, but block more light than transparent material 341 simply by virtue of having increased height. In this case, a clear planarizing layer that doesn't block light might be added to the top or bottom of transparent material 341 to support first microlens 351 on the same plane as second microlens 352 (resting on the thicker semi-transparent material 342). In one embodiment, semi-transparent material 342 and transparent material 341 are made of the same substance, except that transparent material 341 has an array of micro slits or holes that run through all or a portion of the thickness of the transparent material so that more image light 399 is passed through transparent material 341 than is passed through semi-transparent material 342. In yet another embodiment, semi-transparent material 342 may be made from polytetrafluoroethylene ("PTFE") that includes additives (e.g. titanium dioxide) to adjust transparency as desired.

Figure 4:
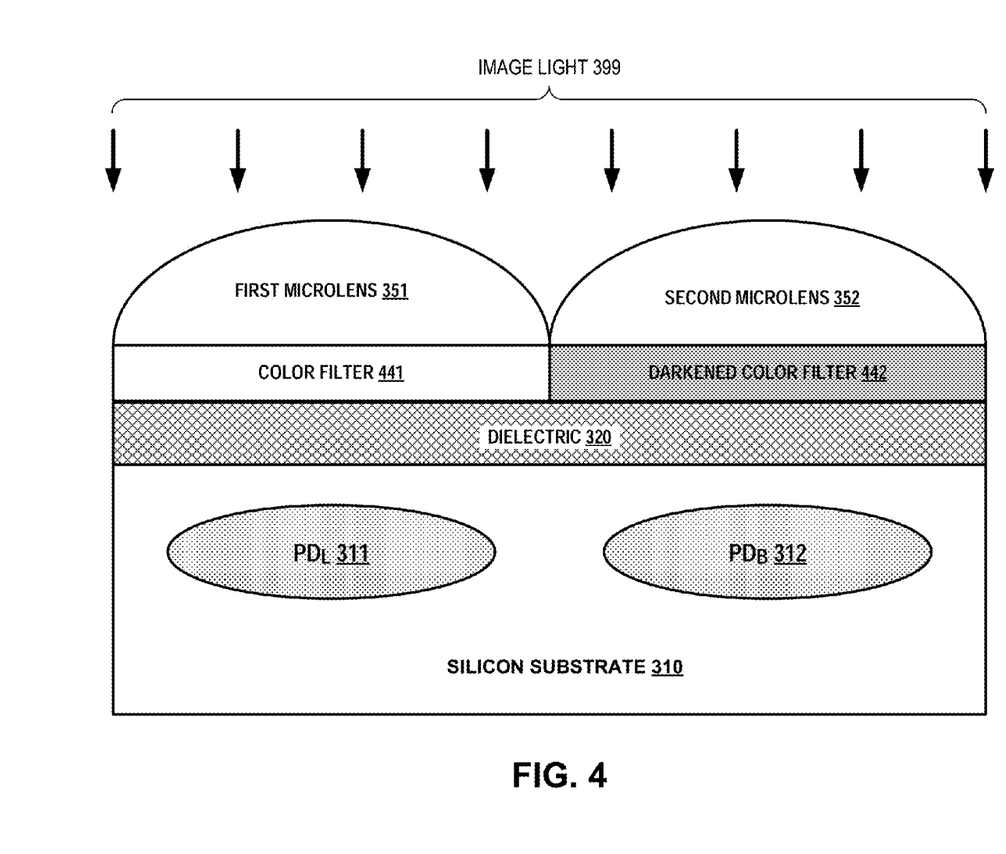
FIG. 4 is a cross-section illustration of two photodiodes and two microlenses that can be used in an example HDR pixel, in accordance with an embodiment of the disclosure.

FIG. 4 is a cross-section illustration of first photodiode 311, second photodiode 312, first microlens 351, second microlens 352, color filter 441, and darkened color filter 442, in accordance with an embodiment of the disclosure. FIG. 4 has similarities to the embodiment illustrated in FIG. 3, but there are some notable differences. In FIG. 4, darkened color filter 442 is disposed between second microlens 352 and second photodiode 312 to reduce the intensity of image light 399 that is incident upon second photodiode 312. Darkened color filter 442 does not substantially affect image light 399 directed to first photodiode 311. Color filter 441 is disposed between first photodiode 311 and first microlens 351. Darkened color filter 442 is 50% less transmissive than color filter 441 in one embodiment. Darkened color filter 442 and color filter 441 may have similar transmission characteristics (allowing a certain color spectrum to pass while substantially blocking all other visible light spectrums) except that darkened color filter 442 will allow a lower percentage of image light 399 to pass. Color filter 441 and darkened color filter 442 allow the same color (e.g. red, green, or blue) of light to pass.

In FIG. 3, semi-transparent material 342 and transparent material 341 control the intensity of image light 399 received by photodiodes 311/312. In FIG. 4, darkened color filter 442 and color filter 441 control the intensity of image light received by photodiodes 311/312. These embodiments allow first photodiode 311 to be the low light photodiode and second photodiode 312 to be the bright light photodiode in an HDR pixel as photodiode 311 receives more image light 399 than photodiode 312. Controlling the intensity of image light 399 using filters allows the microlenses and photodiodes to remain the same in the bright light photodiode (312) and the low light photodiode (311). Therefore, the embodiments of FIGS. 3 and 4 are configured so that photodiodes 311/312 have similar (if not equal) full well capacities. Having photodiodes with the same full well capacities may increase the accuracy and reduce the complexity of signal processing. This allows for simpler readout circuitry and/or reduced digital processing steps yielding faster and cheaper signal processing. The embodiments of FIGS. 3 and 4 also have substantially identical microlenses 351/352, which keeps the optical characteristics (ray angles) of the photodiodes the same, which also reduces signal processing complexity.

The embodiment of FIG. 4 may offer a smaller stack height than the embodiment illustrated in FIG. 3 because it requires fewer layers between the microlenses and photodiodes. This may increase the quantum efficiency of the embodiment of FIG. 4. The embodiment of FIG. 3 may be fabricated using fewer process steps than the embodiment of FIG. 4.

Figure 5:
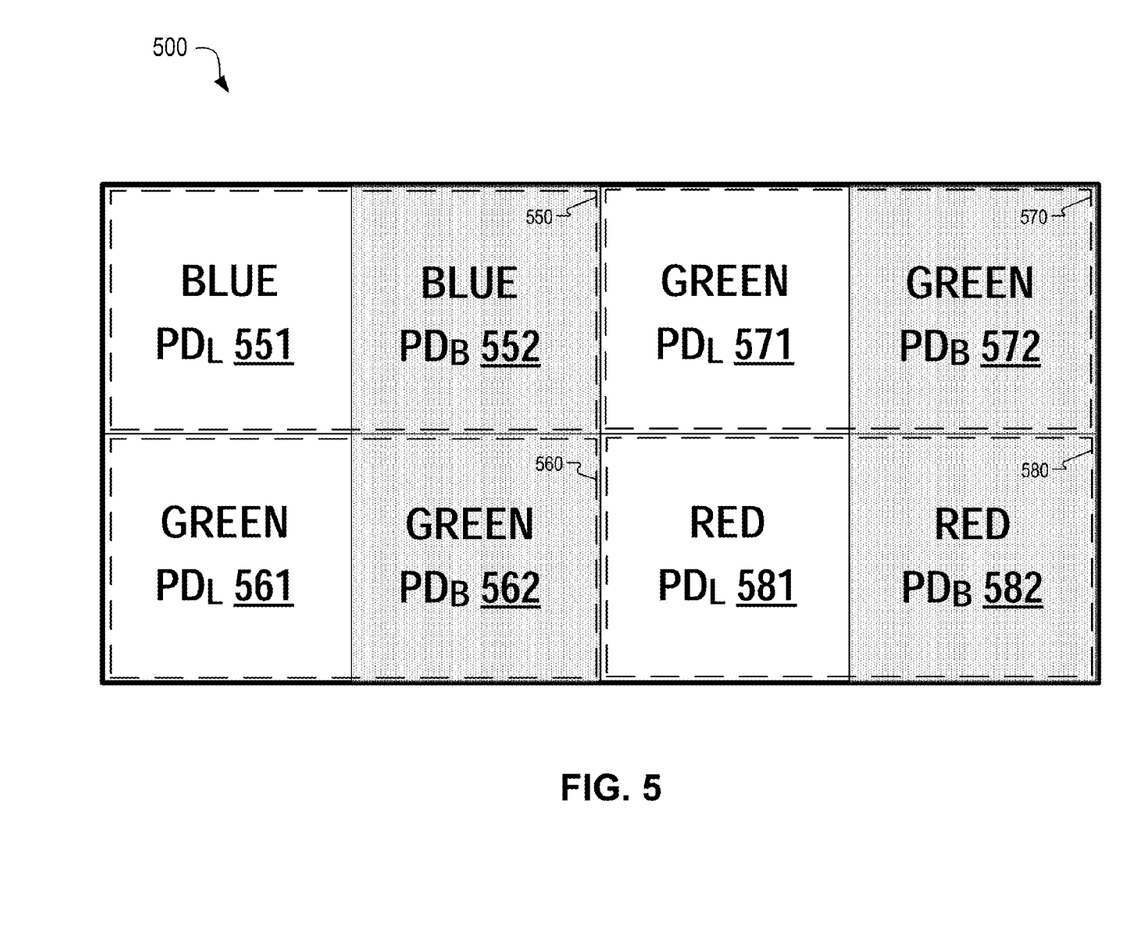
FIG. 5 is a plan view illustration of a multi-color image sensor pixel for use in an HDR image sensor that includes four color pixels that each include an HDR sub-pixel having two photodiodes, in accordance with an embodiment of the disclosure.

FIG. 5 is a plan view illustration of a multi-color image sensor pixel 500 for use in an HDR image sensor that includes four color pixels that each include an HDR sub-pixel having two photodiodes, in accordance with an embodiment of the disclosure. The four color pixels include a red pixel 580, a blue pixel 550, a green pixel 560, and a green pixel 570. Each color pixel includes an HDR sub-pixel that includes a first photodiode ($PD_L$) and second photodiode ($PD_B$). The HDR sub-pixel may have the same electrical circuit configuration as HDR pixel 210 with photodiode 551 and photodiode 552 being placed as photodiode 235 and photodiode 245, respectively. The HDR sub-pixel may be implemented using the filter embodiments discussed in connection with FIGS. 3 and 4.

The HDR sub-pixel in blue pixel 550 includes first photodiode 551 ($PD_L$) and second photodiode 552 ($PD_B$). The HDR sub-pixel in green pixel 560 includes first photodiode 561 ($PD_L$) and second photodiode 562 ($PD_B$). The HDR sub-pixel in green pixel 570 includes first photodiode 571 ($PD_L$) and second photodiode 572 ($PD_B$). And, the HDR sub-pixel in red pixel 580 includes first photodiode 581 ($PD_L$) and second photodiode 582 ($PD_B$). Photodiodes 552, 562, 572, and 582 are each shaded in FIG. 5 to indicate that they are disposed under either a semi-transparent material 342 (FIG. 3 embodiment) or darkened color filter 442 (FIG. 4 embodiment) while their adjacent photodiodes 551, 561, 571, and 581 are not disposed under the semi-transparent material or darkened color filter.

Figure 6:
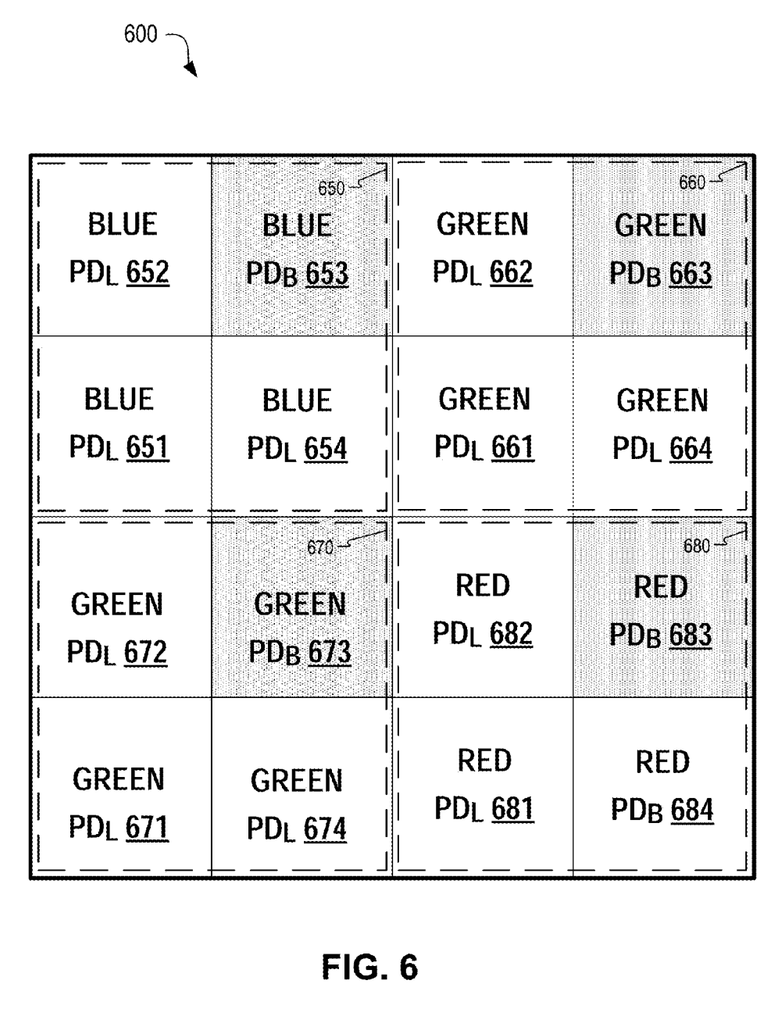
FIG. 6 is a plan view illustration of a multi-color image sensor pixel for use in an HDR image sensor that includes four color pixels that each include an HDR sub-pixel having four photodiodes, in accordance with an embodiment of the disclosure.

FIG. 6 is a plan view illustration of a multi-color image sensor pixel 600 for use in an HDR image sensor that includes four color pixels that each include an HDR sub-pixel having four photodiodes, in accordance with an embodiment of the disclosure. The four color pixels include a red pixel 680, a blue pixel 650, a green pixel 660, and a green pixel 670. Each color pixel includes an HDR sub-pixel that includes a first photodiode ($PD_L$), a second photodiode ($PD_B$), a third photodiode ($PD_L$), and a fourth photodiode ($PD_L$). Each of the four photodiodes have the same full well capacity. The HDR sub-pixel may be implemented using the filter embodiments discussed in connection with FIGS. 3 and 4 with the third and fourth photodiodes being configured similarly to the first photodiode. In this configuration, the first, third, and fourth photodiodes collect low light image data, while the second photodiode collects bright light image data.

The HDR sub-pixel in blue pixel 650 includes photodiode 651 ($PD_L$), photodiode 652 ($PD_L$), photodiode 653 ($PD_B$), and photodiode 654 ($PD_L$). The HDR sub-pixel in green pixel 660 includes photodiode 661 ($PD_L$), photodiode 662 ($PD_L$), photodiode 663 ($PD_B$), and photodiode 664 ($PD_L$). The HDR sub-pixel in green pixel 670 includes photodiode 671 ($PD_L$), photodiode 672 ($PD_L$), photodiode 673 ($PD_B$), and photodiode 674 ($PD_L$). And, the HDR sub-pixel in red pixel 680 includes photodiode 681 ($PD_L$), photodiode 682 ($PD_L$), photodiode 683 ($PD_B$), and photodiode 684 ($PD_L$). Photodiodes 653, 663, 673, and 683 are each shaded in FIG. 6 to indicate that they are disposed under either a semi-transparent material 342 (FIG. 3 embodiment) or darkened color filter 442 (FIG. 4 embodiment) while their corresponding low light photodiodes are not disposed under the semi-transparent material or darkened color filter.

Figure 7A:
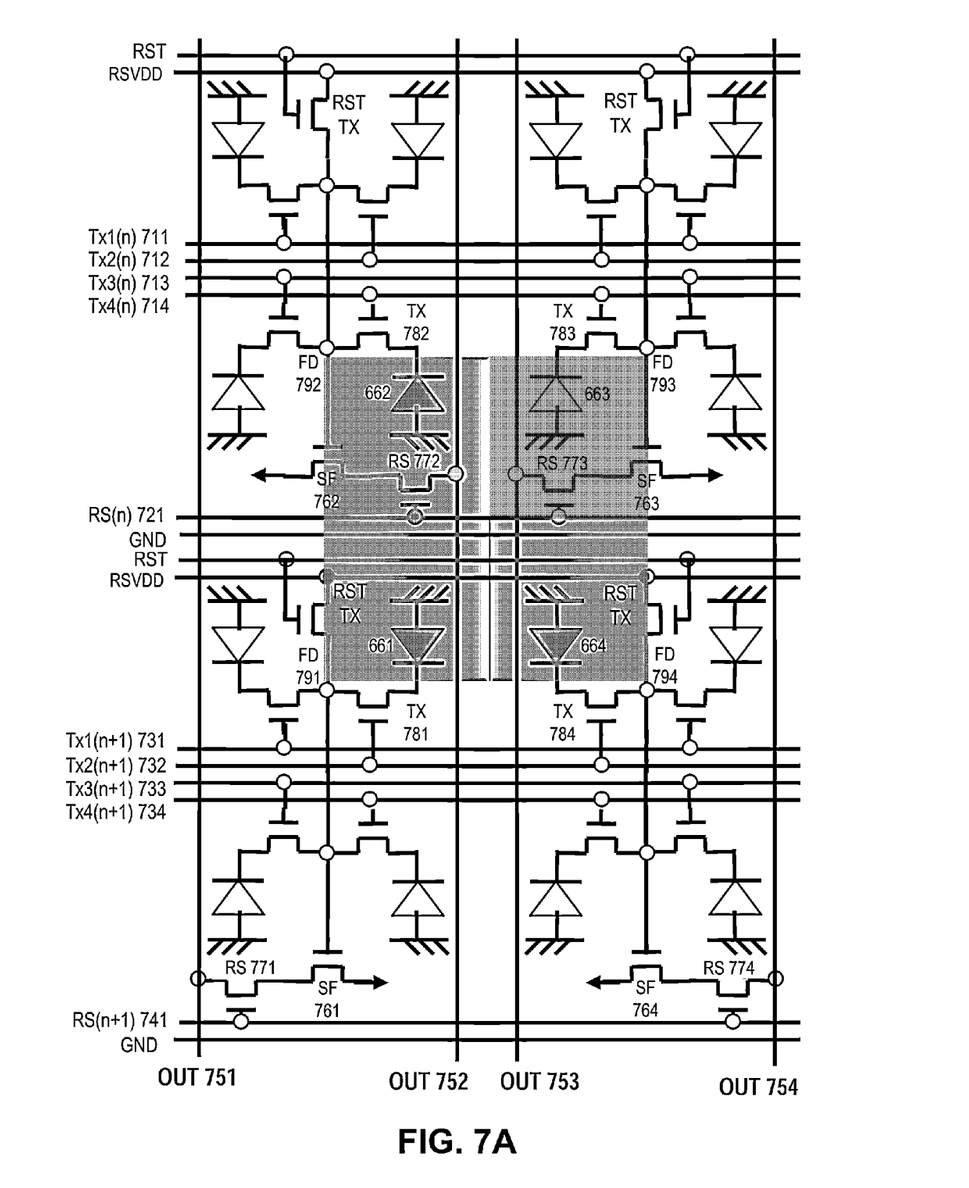
FIG. 7A illustrates an example circuit schematic that includes an HDR sub-pixel that includes four photodiodes that receive light from a specific color spectrum, in accordance with an embodiment of the disclosure.

FIG. 7A illustrates an example circuit schematic that includes green pixel 660 having an HDR sub-pixel that includes photodiodes 661, 662, 663, and 664 that receive green light, in accordance with an embodiment of the disclosure. Although only green pixel 660 is specifically illustrated, the appropriate filters can be disposed over the remaining photodiodes in FIG. 7A to include blue pixel 650, green pixel 670, and red pixel 680. Those skilled in the art will also appreciate that the circuit in FIG. 7A can be expanded to include more rows and columns to accommodate a color CMOS pixel array.

In FIG. 7A, image light 399 will travel through green color filters to reach photodiodes 661, 662, 663, and 664. Photodiode 663 will receive a smaller quantum of image light 399 than photodiode 661, 662, and 664 because it is disposed under either semi-transparent material 342 or darkened color filter 442. Image light 399 generates image charge in photodiodes 661, 662, 663, and 664.

Figure 7B:
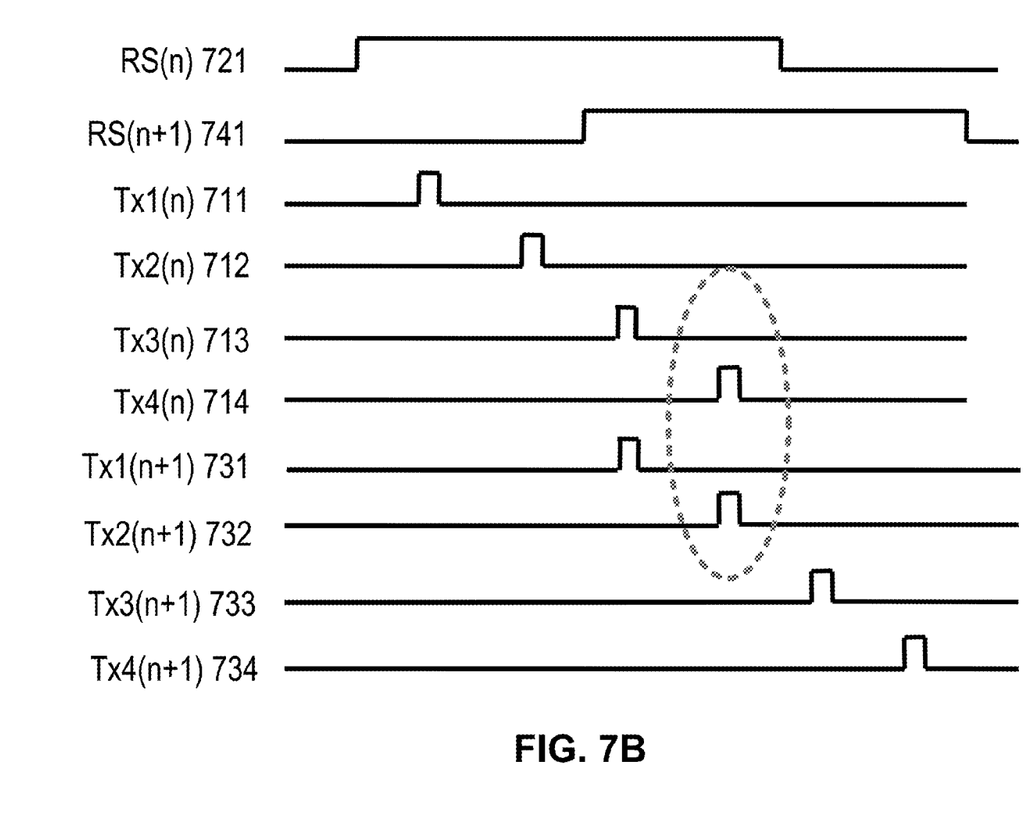
FIG. 7B illustrates an example timing diagram that corresponds with the example circuit schematic of FIG. 7A, in accordance with an embodiment of the disclosure.

FIG. 7B illustrates an example timing diagram that corresponds with the example circuit schematic of FIG. 7A, in accordance with an embodiment of the disclosure. To readout the image charge in photodiodes 661, 662, 663, and 664, signals Tx4(n) 714 and Tx2(n+1) 732 are asserted to activate transfer transistors 781, 782, 783, and 784, which transfers the image charge to floating diffusions 791, 792, 793, and 794, respectively. The image charge transferred to floating diffusions 791, 792, 793, and 794 are amplified by source follower transistors 761, 762, 763, and 764. As shown in FIG. 7B, row select signals RS(n) 721 and RS(n+1) 741 are asserted high at the same time that Tx4(n) 714 and Tx2(n+1) 732 are asserted, which couples the amplified image charge signals onto readout columns 751, 752, 753, and 754 at the same time. Since the amplified image charges signals are present on readout columns 751, 752, 753, and 754 at the same time, the signals from low light photodiodes 661, 662, and 664 can easily be summed (either in a summing circuit or in firmware after analog-to-digital conversions). Summing the three low light signals increases the overall low light signal which increases the low light sensitivity of each color pixel.

Those skilled in the art appreciate that the photodiodes, transfer transistors, and signal lines that are not specifically discussed above can be utilized to read out other color pixels that include the undiscussed photodiodes and transfer transistors. In practice, the circuitry illustrated in FIG. 7A may be repeated to include an array of multi-color image pixels to form an array of multi-color image sensor pixel to generate HDR color pixels. Repeating the circuitry illustrated in FIG. 7A and integrating the multi-color image pixel illustrated in FIG. 6 with that circuitry allows for a systematic readout of multi-color HDR image pixels.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel for use in a high dynamic range image sensor, the image sensor pixel comprising:
   a first photodiode disposed in a semiconductor material;
   a second photodiode disposed in the semiconductor material and having a second full well capacity substantially equal to a first full well capacity of the first photodiode, wherein the first photodiode is disposed adjacent to the second photodiode in the semiconductor material;
   a first microlens disposed over the first photodiode to direct image light toward the first photodiode;
   a second microlens disposed over the second photodiode to direct the image light toward the second photodiode, wherein the second microlens is substantially identical to the first microlens; and
   a filter disposed between the second microlens and the second photodiode to reduce an intensity of a first color of the image light incident upon the second photodiode, wherein the filter does not substantially affect the first color of the image light directed toward the first photodiode, and wherein less of the image light is transmitted to the second photodiode than the first photodiode.

2. The image sensor pixel of claim 1, wherein the filter is a darkened color filter that passes the first color of the image light while substantially blocking the image light that is other than the first color, the image sensor pixel further comprising an undarkened color filter disposed between the first microlens and the first photodiode, wherein the undarkened filter passes the first color while substantially blocking the image light that is other than the first color.

3. The image sensor pixel of claim 1, wherein the filter is a semi-transparent material, the image sensor pixel further comprising:
   a material that is more transmissive than the semi-transparent material, wherein the material is disposed between the first microlens and the first photodiode; and
   a color filter disposed beneath both the first microlens and the second microlens, the color filter passing a first color of the image light while substantially blocking the image light that is other than the first color.

4. The image sensor pixel of claim 1 further comprising:
   a shared floating diffusion;
   a first transfer transistor disposed in the semiconductor material to transfer first image charge from the first photodiode to the shared floating diffusion, wherein the first image charge is generated by the image light incident upon the first photodiode; and a second transfer transistor disposed in the semiconductor material to transfer second image charge from the second photodiode to the shared floating diffusion, wherein the second image charge is generated by the image light incident upon the second photodiode.

5. The image sensor pixel of claim 4, wherein the first transfer transistor and the second transfer transistor are coupled to be activated separately.

6. The image sensor pixel of claim 4 further comprising a reset transistor disposed in the semiconductor material and coupled to the shared floating diffusion.

7. The image sensor pixel of claim 4 further comprising:
an amplifier transistor disposed in the semiconductor material and coupled to amplify an image signal on the shared floating diffusion; and
a select transistor disposed in the semiconductor material between the amplifier transistor and a readout column line.

8. The image sensor pixel of claim 1, wherein the semiconductor material includes a silicon substrate.

9. The image sensor pixel of claim 1, wherein a dielectric layer is disposed between the filter and the semiconductor material.

10. The image sensor pixel of claim 1, where the first photodiode and the second photodiode have a same light exposure area.

11. A multi-color image sensor pixel for use in a high dynamic range ("HDR") image sensor, the multi-color image sensor pixel comprising:
a first color pixel for sensing a first color of image light; and
a second color pixel for sensing a second color of image light different from the first color of image light, wherein the first color sub-pixel and the second color pixel each include an HDR sub-pixel comprising:
a first photodiode disposed in a semiconductor material;
a second photodiode disposed in the semiconductor material and having a second full well capacity substantially equal to a first full well capacity of the first photodiode, wherein the first photodiode is disposed adjacent to the second photodiode in the semiconductor material;
a first microlens disposed over the first photodiode to direct image light toward the first photodiode;
a second microlens disposed over the second photodiode to direct the image light toward the second photodiode, wherein the second microlens is substantially identical to the first microlens; and
a filter disposed between the second microlens and the second photodiode to reduce an intensity of a color spectrum of the image light incident upon the second photodiode, wherein the filter does not substantially affect the color spectrum of the image light directed toward the first photodiode, and wherein less of the image light is transmitted to the second photodiode than the first photodiode.

12. The multi-color image sensor pixel of claim 11, wherein the filter included in each HDR sub-pixel is a darkened color filter that passes the color spectrum of the image light associated with a given color sub-pixel of the multi-color image sensor pixel while substantially blocking the image light that is other than the color spectrum associated with the given color sub-pixel, each HDR sub-pixel further comprising an undarkened color filter disposed between the first microlens and the first photodiode, wherein the undarkened filter passes the color spectrum associated with the given color sub-pixel while substantially blocking the image light that is other than the color spectrum associated with the given color sub-pixel.

13. The multi-color image sensor pixel of claim 12, wherein the first color of image light is green and the second color of image light is red.

14. The multi-color image sensor pixel of claim 11, wherein the filter is a semi-transparent material, the HDR sub-pixel further comprising:
a material that is more transmissive than the semi-transparent material, wherein the material is disposed between the first microlens and the first photodiode; and
a color filter disposed beneath both the first microlens and the second microlens, the color filter passing the color spectrum of image light associated with a given color sub-pixel of the multi-color image sensor pixel while substantially blocking the image light that is other than the color spectrum associated with the given color sub-pixel.

15. The multi-color image sensor pixel of claim 14, wherein the first color of image light is green and the second color of image light is red.

16. The multi-color image sensor pixel of claim 11 further comprising:
a third color pixel for sensing a third color of image light different from the first color of image light and the second color of image light; and
a fourth color pixel for sensing the first color of image light, wherein the third and fourth color pixels each include the HDR sub-pixel.

17. The multi-color image sensor pixel of claim 16, wherein the first color is green, the second color is red, and the third color is blue.

18. The multi-color image sensor pixel of claim 11, wherein the HDR sub-pixel further comprises:
a third photodiode disposed in the semiconductor material;
a third microlens disposed over the third photodiode to direct image light toward the third photodiode;
a fourth photodiode disposed in the semiconductor material; and
a fourth microlens disposed over the fourth photodiode to direct image light toward the fourth photodiode, wherein the filter does not substantially affect the image light directed toward the third and fourth photodiodes.

19. The multi-color image sensor pixel of claim 18, wherein the first, second, third, and fourth photodiodes are coupled to be read out simultaneously at a first, second, third, and fourth readout node, respectively.

20. The multi-color image sensor pixel of claim 19, wherein the first, second, third, and fourth photodiodes have first, second, third, and fourth transfer transistors, respectively, to transfer image charge out of the respective photodiode, and wherein first and second gates of the first and second transfer transistors are coupled together, the third and fourth transfer transistors having third and fourth gates that are coupled together.

* * * * *